US006218196B1

(12) United States Patent
Ise et al.

(10) Patent No.: US 6,218,196 B1
(45) Date of Patent: Apr. 17, 2001

(54) ETCHING APPARATUS, ETCHING METHOD, MANUFACTURING METHOD OF A SEMICONDUCTOR DEVICE, AND SEMICONDUCTOR DEVICE

(75) Inventors: Hirotoshi Ise; Takayuki Ikushima; Minoru Hanazaki; Nobuhiro Nishizaki, all of Tokyo (JP)

(73) Assignees: Mitsubishi Denki Kabushiki Kaisha; Mitsubishi Electric Engineering Co., Ltd., both of Tokyo (JP)

( * ) Notice: Subject to any disclaimer, the term of this patent is extended or adjusted under 35 U.S.C. 154(b) by 0 days.

(21) Appl. No.: 09/188,117

(22) Filed: Nov. 9, 1998

(30) Foreign Application Priority Data

May 6, 1998 (JP) .................................. 10-123028

(51) Int. Cl.[7] .............................................. H01L 21/461
(52) U.S. Cl. .......................................... 436/689; 438/689
(58) Field of Search .................................. 438/689, 726, 438/729, 714, 710, 720, 728, 734

(56) References Cited

U.S. PATENT DOCUMENTS

| 4,324,611 | * | 4/1982 | Vogel et al. .......................... 156/643 |
| 4,380,488 | * | 4/1983 | Rechederfer et al. ................ 156/643 |
| 5,352,324 | * | 10/1994 | Gotoh et al. .......................... 156/643 |
| 5,614,060 | | 3/1997 | Hanawa . |
| 5,891,348 | * | 4/1999 | Ye et al. .................................. 216/67 |
| 6,008,132 | * | 12/1999 | Tabara .................................. 438/714 |

FOREIGN PATENT DOCUMENTS

| 3-273626 | 12/1991 | (JP) . |
| 6-61182 | 3/1994 | (JP) . |
| 6-216089 | 8/1994 | (JP) . |
| 6-342769 | 12/1994 | (JP) . |
| 8-20880 | 1/1996 | (JP) . |
| 8-241885 | 9/1996 | (JP) . |
| 8-339989 | 12/1996 | (JP) . |
| 9-260359 | 10/1997 | (JP) . |
| 9-260391 | 10/1997 | (JP) . |

* cited by examiner

Primary Examiner—David Nelms
Assistant Examiner—David Nhu
(74) Attorney, Agent, or Firm—McDermott, Will & Emery

(57) ABSTRACT

Two electrodes are provided in a processing container so as to be opposed to each other. Main etching processing gases of $Cl_2$ and $BCl_3$ are introduced into the processing container, and a deposition-type gas composed by least two of C, H, and F, such as a $CHF_3$ gas or a $CF_4$ gas, is added thereto. A plasma is generated by applying a pulse-modulated high-frequency voltage between the two electrodes that hold a sample to be etched. The sample is etched by using the plasma.

9 Claims, 8 Drawing Sheets

P : 24 mTorr
BCl3/Cl2 : 20/80 sccm
13.56 MHz : 600 W
150 Gauss
Frequency : 1 KHz
Duty ratio : 50%

Add $CHF_3$ gas(deposition - type gas) :
% (flow rate to $Cl_2$ gas)

ETCHING APPARATUS, ETCHING METHOD, MANUFACTURING METHOD OF A SEMICONDUCTOR DEVICE, AND SEMICONDUCTOR DEVICE

BACKGROUND OF THE INVENTION

1. Field of the Invention

The present invention relates to an etching apparatus and method and, more specifically, to a plasma etching apparatus and method for performing etching by generating a plasma with pulse modulation. The invention also relates to a manufacturing method of a semiconductor using such an etching apparatus or method, as well as to a semiconductor device manufactured by that method.

2. Background Art

In recent years, as the degrees of integration of semiconductor devices etc. increase, their densities have increased at high speed by miniaturization of patterns. Particularly in the technical fields of DRAMs, ASICs, etc. where vertically processed shapes of a half micron or less are required, etching techniques capable of high-precision processing are needed. The dry etching technique is widely used as one of such means.

FIG. 14 shows the configuration of a conventional RF-biased etching apparatus. This is an example of most typical dry etching techniques using an RF bias. In FIG. 14, reference numeral 1 denotes a reaction container for maintaining a vacuum. The pressure in the reaction container 1 is controlled by an evacuation outlet 2, a vacuum pressure indicator 3, and a vacuum pressure setting valve 4b. Flow rate controllers 4a cause etching gases such as $Cl_2$ and $BCl_3$ to be introduced into the reaction container 1 through gas introduction inlets 5 while controlling their flow rates. A semiconductor substrate as a sample 6 to be etched is held by one of two opposed electrodes 7 that form a capacitor. The opposed electrodes 7 are connected to a matching box 10 for a plasma impedance control and a high-frequency power supply 8. The high-frequency power supply 8 produces a sinusoidal voltage.

In this etching apparatus, negative charges are accumulated on the side of the sample-side one of the electrodes 7 that form a capacitor, because electrons supplied from a generated plasma are tens of times more than ions. Because of those capacitor charges, as shown in FIG. 15, a voltage that is shifted to the negative side appears on the semiconductor substrate as the sample 6 to be etched. Because of the presence of this negative voltage, positive ions as etching species are accelerated and strike the semiconductor substrate, to enable anisotropic etching. As disclosed in Japanese Unexamined Patent Publication Nos. 6-61182, 8-241885, 8-20880, etc., there have been invented dry etching methods that use a bias voltage having a pulse waveform.

In etching methods using a bias voltage having a pulse waveform, etching of a high selective ratio is possible and hence fine processing margins are increased. The term selective ratio as used above is defined by a ratio of the etching rate of a sample film to that of a photoresist for masking the sample film to be etched. However, since the rate of ion incidence on a sample film is low, the amount of reaction products that are produced from a photoresist and etching gases is small. Therefore, side wall protective films are thin in forming metal interconnections by etching the sample film. Accordingly, it is difficult to provide processed metal interconnections having good shapes due to side etching or roughening of side walls of interconnection.

Further, as disclosed in Japanese Unexamined Patent Publication No. 9-260359, there has been invented an etching method in which an etching gas of $Cl_2$ and a deposition-type gas of $CHF_3$ are used as well as a pulse waveform bias voltage is applied. However, this etching method possibly has problems that are fatal to an etched film from the viewpoint of recent etching techniques for fine processing. The problems are excess depositions of reactive products that are produced from $CHF_3$ and ions such as $Cl^-$, etching residues, short-circuiting of wiring, and shape differences due to pattern density differences in a film to be etched.

SUMMARY OF THE INVENTION

The present invention has been made to solve the above problems in the conventional art, and an object of the invention is therefore to provide an etching apparatus and method in which a high-frequency application voltage is pulse-modulated, and which uses, for instance, a $Cl_2$ gas and a $BCl_3$ gas as processing gases and, for instance, a $CHF_3$ gas as a deposition-type gas for assisting formation of side wall protective films, which enables etching of a large selective ratio to a photoresist, and which is free of influences of foreign substances due to deposition of reactive products as well as an RIE-lag (etching rate difference between sparse patterns and dense patterns in a film to be etched), and can thereby provide superior vertically etched shapes.

According to one aspect of the present invention, an etching apparatus comprises a processing container and a pair of electrodes provided in the processing container so as to be opposed to each other and to hold a sample to be etched. Also provided is a introducing means for introducing, into the processing container, etching processing gases in which main etching processing gases such as $Cl_2$ gas and a $BCl_3$ gas and a deposition type gas such as composed by at least two of C, H, F are included. Exhausting means is provided for exhausting the etching processing gases from the processing container. Voltage applying means is provided for applying a pulse-modulated high-frequency voltage between the pair of electrodes, to thereby generate a plasma between the pair of electrodes and to etch the sample by using the plasma.

In the voltage applying means, the pulse modulation frequency of the high-frequency voltage that is applied between the two electrodes may be set at a value in a range of 1 Hz to 50 kHz.

In the voltage applying means, the duty ratio of the pulse modulation of the high-frequency voltage that is applied between the two electrodes may be set at a value in a range of 20% to 75%.

In the voltage applying means, the pulse modulation may be performed so that the amplitude of the high-frequency voltage that is applied between the two electrodes has a first predetermined voltage that is 0 V or more in a discharge suspension period and a second predetermined voltage that is higher than the first predetermined voltage in a discharge period.

According to another aspect of the invention, in an etching method, etching processing gases are introducing into a processing container. In the etching processing gases, a deposition-type gas composed at least two of C, H, and F is added to main etching processing gases including a $Cl_2$ gas and a $BCl_3$ gas. A pulse-modulated high-frequency voltage is applied between two electrodes that are provided in the processing container so as to be opposed to each other and to hold a sample to be etched. A plasma is generated between the two electrodes, and the sample is etched by using the plasma.

The deposition-type gas may be one of a $CHF_3$ gas and a $CF_4$ gas.

The deposition-type gas may be added at a flow rate that is in a range of 1% to 45% of a flow rate of the $Cl_2$ gas.

The processing pressure of the etching may be set at a value in a range of 0.665 to 13.3 Pa (5 to 100 mTorr).

The pulse modulation may be performed in such a manner that the high-frequency voltage that is applied between the two electrodes are turned on and off at a modulation frequency in a range of 1 Hz to 50 kHz.

The pulse modulation may be performed in such a manner that the high-frequency voltage that is applied between the two electrodes are turned on and off with a duty ratio in a range of 20% to 75%.

The pulse modulation may be performed so that the amplitude of the high-frequency voltage that is applied between the two electrodes has a first predetermined voltage that is 0 V or more n a discharge suspension period and a second predetermined voltage that is higher than the first predetermined voltage in a discharge period.

According to a further aspect of the invention, there is provided a manufacturing method of a semiconductor method comprising the step of etching a metal layer on a semiconductor substrate by the above-described etching method.

According to still another aspect of the invention, there is provided a semiconductor device manufactured by the above manufacturing method.

Other and further objects, features and advantages of the invention will appear more fully from the following description.

DETAILED DESCRIPTION OF THE PREFERRED EMBODIMENTS

Figure 1:
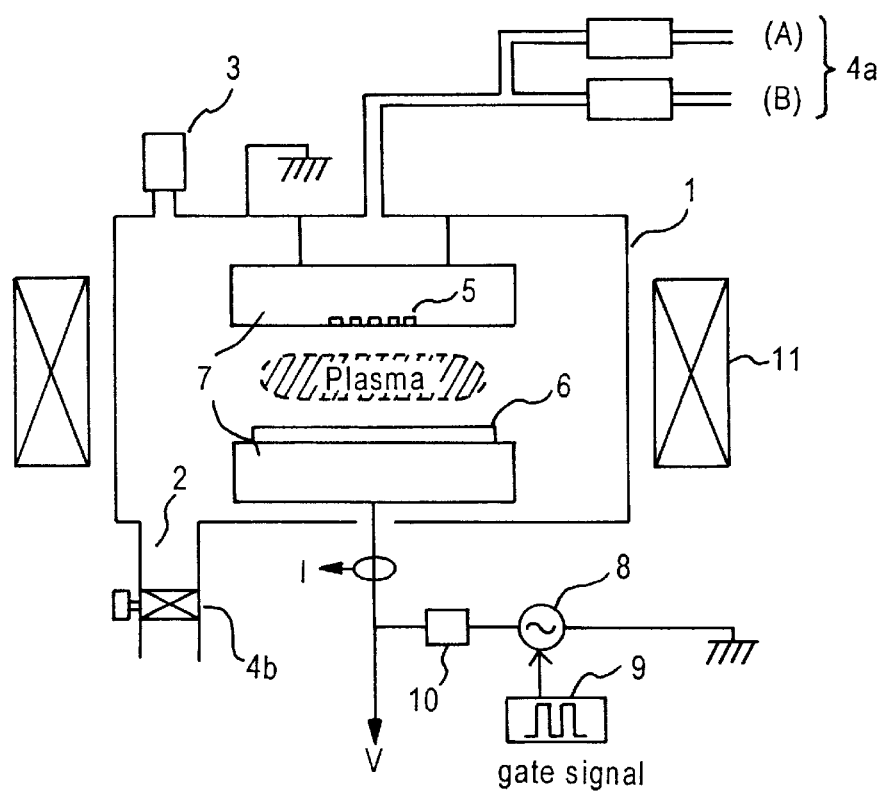
FIG. 1 shows a configuration of an etching apparatus according to a first embodiment of the present invention in which a voltage having a pulse waveform is applied.

Some preferred embodiments of the present invention will be described with reference to the accompanying drawings, in which like reference numerals designate same or corresponding portions.

First Embodiment

FIG. 1 shows the configuration of an etching apparatus according to a first embodiment of the present invention in which a voltage having a pulse waveform is applied. As shown in FIG. 1, the etching apparatus comprises a reaction container (processing container) 1 having in itself a reaction processing space maintained in vacuum, and an evacuation outlet 2 of the reaction container 1. A vacuum pressure indicator 3 is provided for indicating the degree of vacuum in the reaction container 1. Flow rate controllers 4a controls the flow rates of gases to be introduced. A vacuum pressure setting valve 4b sets the vacuum pressure at a prescribed level. Gas holes 5 introduce processing gases into the reaction processing space. A sample 6 is to be etched. Top and bottom electrodes 7 works to generate a plasma. A high-frequency power supply 8 applies a pulse-modulated voltage between the top and bottom electrodes 7. A control signal generator 9 controls the voltage and the discharge period of the pulse-modulated voltage. A matching box 10 controls a plasma impedance. Further, three pairs of solenoid coils 11 controls the plasma density through a magnetic field while a plasma is generated.

Processing gases A and B whose flow rates are set by the respective flow rate controllers 4a are introduced into the reaction container 1 through the gas holes 5. In this embodiment, the processing gases A and B are $Cl_2$ and $BCl_3$, respectively.

The pressure of the reaction processing space in the reaction container 1 is controlled by the flow rate controllers 4a, the vacuum pressure setting valve 4b, the vacuum pressure indicator 3, and the evacuation outlet 2.

Supplied with a voltage from the high-frequency power supply 8, the top and bottom electrodes 7 form a capacitor via the sample 6 to be etched. The control signal generator 9 is connected to the high-frequency power supply 8 (RF power supply). RF power is supplied from the high-frequency power supply 8 to the top and bottom electrodes 7 via the matching box 10.

Gas introduction tubes including the flow rate controllers 4a constitute a gas introducing means, and an exhaust tube including the vacuum pressure setting valve 4b constitutes a gas exhausting means. The high-frequency power supply 8, the generator 9, and the matching box 10 constitute a voltage applying means.

With the above etching apparatus, a plasma is generated between the top and bottom electrodes 7 by applying, between the electrodes 7, a pulse-modulated high-frequency voltage from the high-frequency power supply 8. Ions of the plasma are introduced to the surface of the sample 6 to be etched such as a semiconductor wafer, and the sample 6 is etched by chemical reactions and sputtering.

Figure 2:
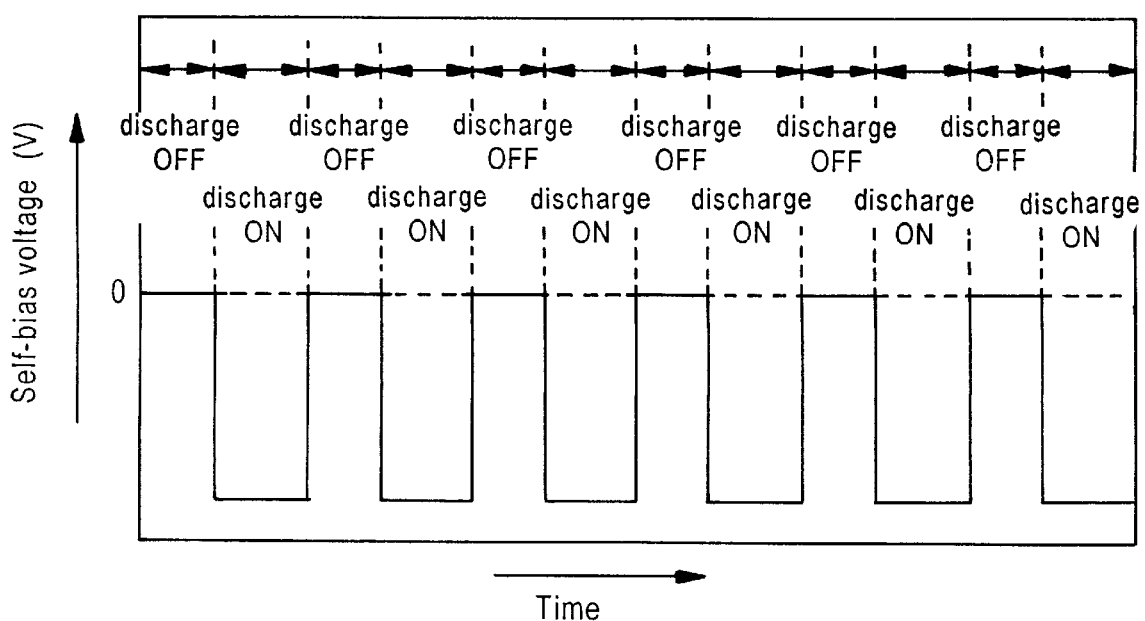
FIG. 2 shows an example of a substrate bias voltage generated on a etching sample by application of a pulse waveform voltage.

FIG. 2 shows an example of a substrate bias voltage generated on a etching sample 6 such as a semiconductor substrate by application of a pulse waveform voltage. Since discharge-on state and a discharge-off state are established repeatedly and alternately, in a discharge-off state the energy of positive ions as charged particles decreases and etching is performed by only a Cl radical component, for instance. In this state, the amount of reaction products that are produced from, for instance, an aluminum wiring film and a photoresist as the etching sample 6 decreases.

Figure 3:
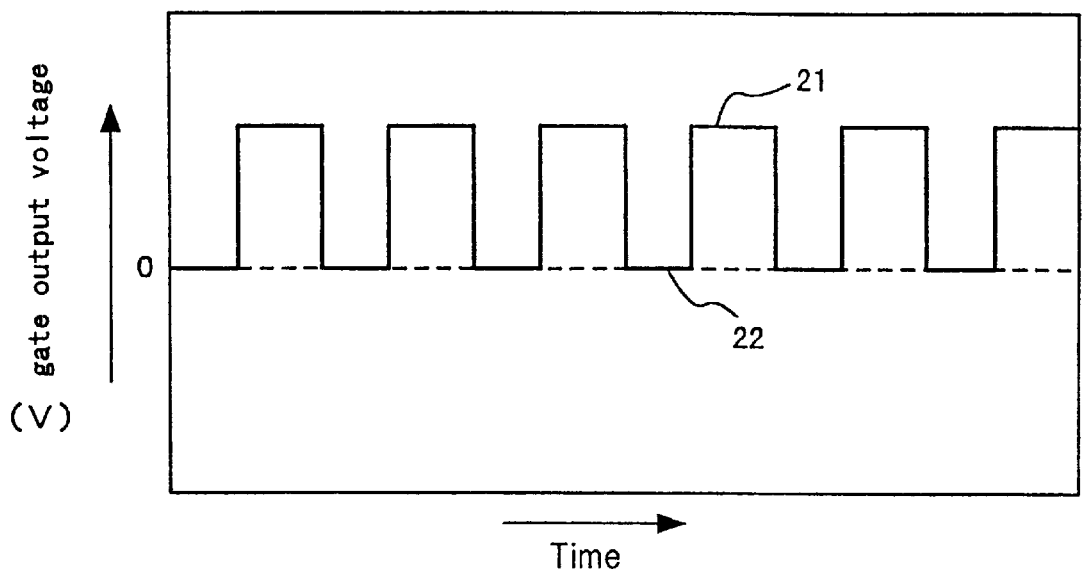
FIG. 3 shows an example of a manner of pulse modulation when a pulse waveform voltage is applied.
Figure 4:
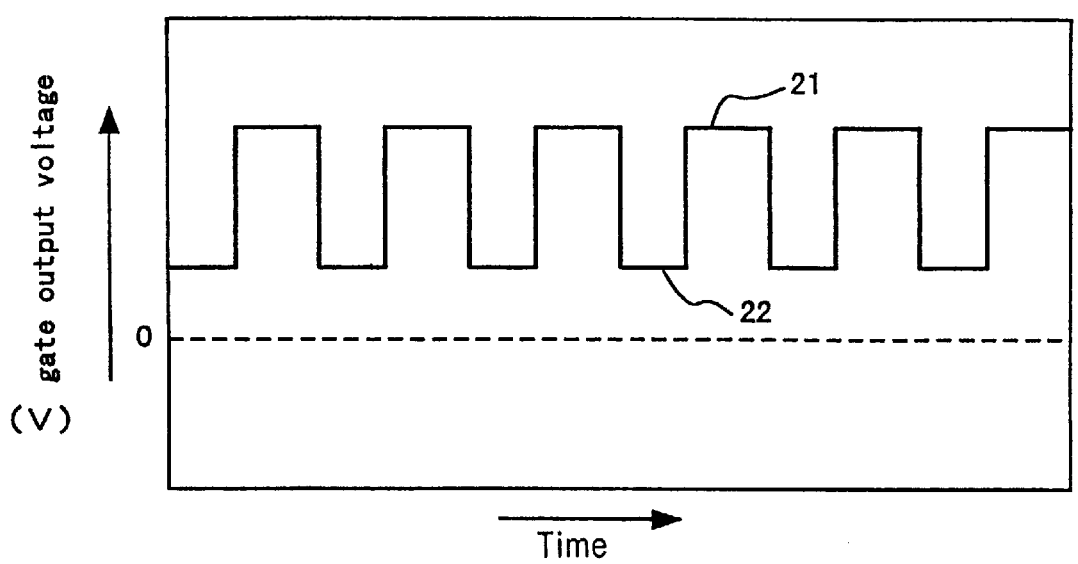
FIG. 4 shows another example of a manner of pulse modulation when a pulse waveform voltage is applied.

FIG. 3 shows an example of a manner of pulse modulation when a pulse waveform voltage is applied. The gate output voltage in FIG. 3 corresponds to the gate signal of the control signal generator 9 in FIG. 1. Reference numerals 21 and 22 denote gate output voltages in a discharge-on state and a discharge-off state, respectively. FIG. 4 shows another example of a manner of pulse modulation when a pulse waveform voltage is applied. As shown in FIG. 4, the gate output voltage 22 in the discharge-off state is higher than 0 V, and the gate output voltage 21 in the gate-on state is higher than the gate output voltage 22. In this situation, similar effects of a pulse waveform voltage can be obtained.

Figure 5:
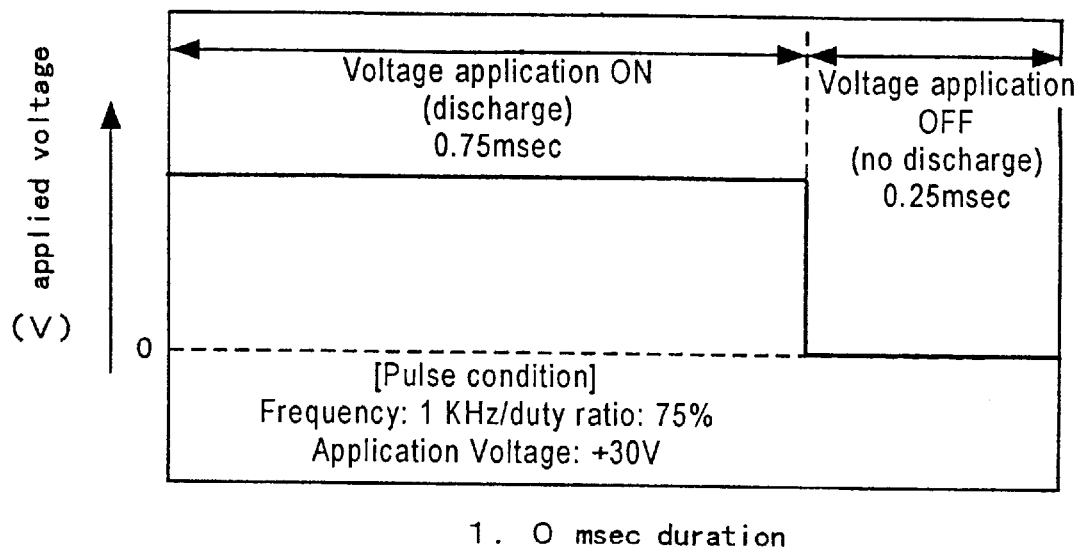
FIG. 5 shows a more specific example of a manner of pulse modulation in an etching method using a pulse waveform voltage.

FIG. 5 shows a more specific example of a manner of pulse modulation in an etching method using a pulse waveform voltage. A duty ratio is used as representing the form of pulsed discharges. The duty ratio means a ratio of the discharge period to the entire period that consists of the discharge period and the suspension period, that is, (discharge period)/(discharge period plus suspension period). For example, in pulsed discharges having a pulse frequency 1 kHz and a duty ratio 75%, a discharge of 0.75 msec and suspension of 0.25 msec are repeated.

Figure 6:
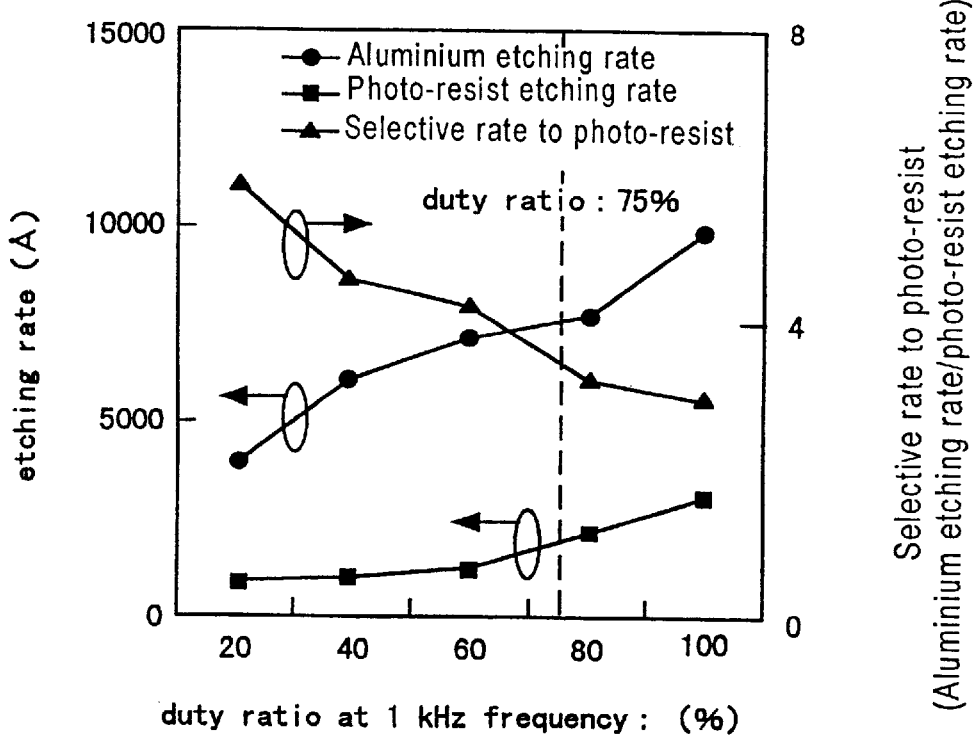
FIG. 6 shows an example of an etching tendency as a function of the duty ratio in an etching method in which the etching apparatus of FIG. 1 is used and a pulse waveform voltage is applied.

FIG. 6 shows an example of an etching tendency as a function of the duty ratio in an etching method in which the etching apparatus of FIG. 1 is used and a pulse waveform voltage is applied.

The frequency of the pulse waveform was fixed at 1 kHz, the film to be etched was an aluminum wiring film, and the duty ratio was changed from 20% to 100%. When the duty ratio is decreased, the discharge-off period is elongated and hence the amount of ions, for instance, Cl ions, incident on a sample wafer are decreased, and the chemical reactions between ions and a mask photoresist is decreased. However, the aluminum wiring film is etched by Cl radicals etc. during discharge-off periods. This chemical reaction enables etching with a high selective ratio to a photoresist. The term selective ratio to a photoresist means a ratio of an aluminum wiring film etching rate to a photoresist etching rate, that is, (aluminum wiring film etching rate)/(photoresist etching rate). As seen from FIG. 6, the selective ratio to a photoresist has a marked increase in a duty ratio range of 20% to 75%.

In this embodiment, the pulse modulation frequency of a pulse waveform voltage is fixed at 1 kHz, and that is the optimum frequency. Similar effects as above can be obtained as long as the pulse modulation frequency falls at least within a range of 1 Hz to 50 kHz and the duty ratio falls at least within a range of 20% to 75%.

Figure 7:
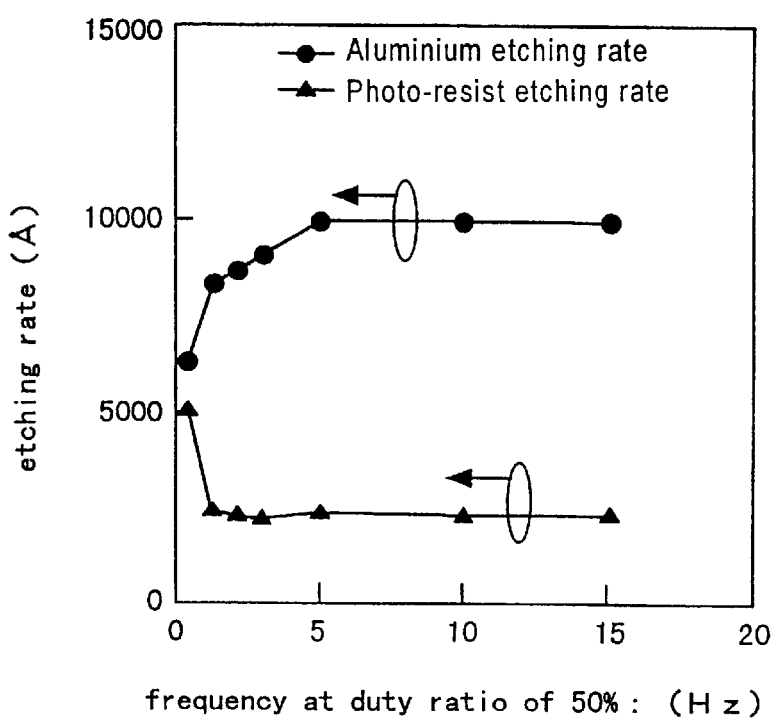
FIG. 7 shows an example of an etching tendency as a function of the pulse frequency in a case where the etching apparatus of FIG. 1 is used and a pulse waveform voltage is applied.

FIG. 7 shows an example of an etching tendency as a function of the pulse frequency in a case where the etching apparatus of FIG. 1 is used and a pulse waveform voltage is applied. In this case, the duty ratio of pulse modulation was fixed at 50%. The etched sample was a wafer for manufacture of semiconductor devices such as DRAMs or ASICs in which a film to be etched was constituted of an aluminum-copper film etc., the aperture ratio of acetal wiring layer was 60% or less, the photoresist occupation area was relatively large in the wafer surface, and the aspect ratio, that is, (etching depth)/(width of interconnection opening), fell at least within a range of 0.5 to 25.0 at densest patterns of metal interconnections. Etching was performed by using a $Cl_2$ gas (80 sccm) and a $BCl_3$ gas (20 sccm) as processing gases.

The selective ratio to a resist, that is, the ratio of aluminum etching rate to the photoresist etching rate has a marked increase in a frequency range of 1 Hz to 10 kHz.

In this embodiment, the modulation duty ratio of a pulse waveform is fixed at the optimum value of 50%. Similar effects as obtained above can be obtained in a frequency range of 1 Hz to 50 kHz as long as the duty ratio falls at least within a range of 20% to 75%.

Figure 8:
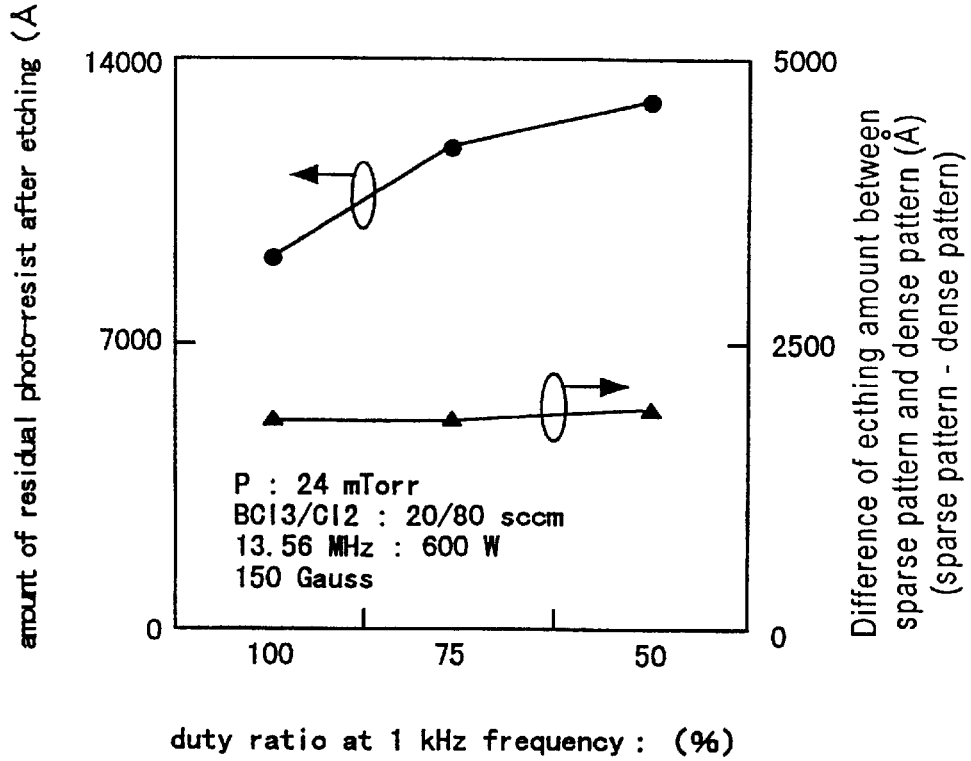
FIG. 8 exemplifies how the residual amount of photoresist film in etching vary with the duty ratio.

FIG. 8 exemplifies how the residual amount of photoresist film in etching vary with the duty ratio. FIG. 8 also exemplifies how the etching removal amount (RIE-lag amount) differs with the duty ratio depending on the interconnection density in a etched film. In this etching, the etching apparatus of FIG. 1 is used and a pulse waveform voltage is applied.

In this case, the etched sample was a wafer for manufacture of semiconductor devices such as DRAMs or ASICs in which an etched film was constituted of an aluminum-copper film etc., the aperture ratio of a metal wiring layer was 60% or more, the photoresist occupation area was relatively small in the wafer surface, and the aspect ratio, that is, (etching depth)/(width of interconnection opening), fell at least within a range of 0.5 to 25.0 at densest patterns of metal interconnections.

Processing gases were a $Cl_2$ gas (80 sccm) and a $BCl_3$ gas (20 sccm). The pulse modulation frequency was 1 kHz and the duty ratio was changed from 100% to 50%.

There occurs a difference in etching rate due to a difference in the reaction rate of ions such as $Cl^-$, a difference in plasma density, and other factors that are caused by an interconnection density difference in an etched film. This etching rate is regarded as corresponding to the difference in etching removal amount (RIE-lag amount) between sparse patterns and dense patterns.

In FIG. 8, the difference in etching removal amount (RIE-lag amount) is defined as difference of the etching amount between sparse patterns and dense patterns. (It is assumed that there is no etching rate difference between sparse patterns and dense patterns when the RIE-lag amount is 0 Å.)

The ratio of the power-on period decreases as the duty ratio decreases with reference to FIG. 8. Therefore, the amount of ions such as $Cl^-$ that are introduced into the film to be etched decreases and hence the frequency of occurrence of CHCl-type and CCl-type reactions decreases, resulting in an increase in the photoresist film residual amount. On the other hand, etching by Cl-type radicals proceeds. In this manner, etching of a high selective ratio to a resist is enabled.

However, when a $Cl_2$ gas is solely used, side etching or side wall roughening of the etched film caused by Cl-type radicals during power-off periods is not sufficiently prevented. Therefore, it is necessary to suppress side etching and side wall roughening by introducing a $BCl_3$ gas and thereby sputtering the photoresist and forming side wall protective films by CHCl-type and CCl-type reactions.

Introducing $BCl_3$ and forming CHCl-type and CCl-type substances to suppress side etching and side wall roughening is in a tradeoff relationship with a high selective ratio to a resist. The RIE-lag amount does not decrease in an etching process in which $Cl_2$ and $BCl_3$ gases are used as processing gases and pulse modulation is performed.

Figure 9:
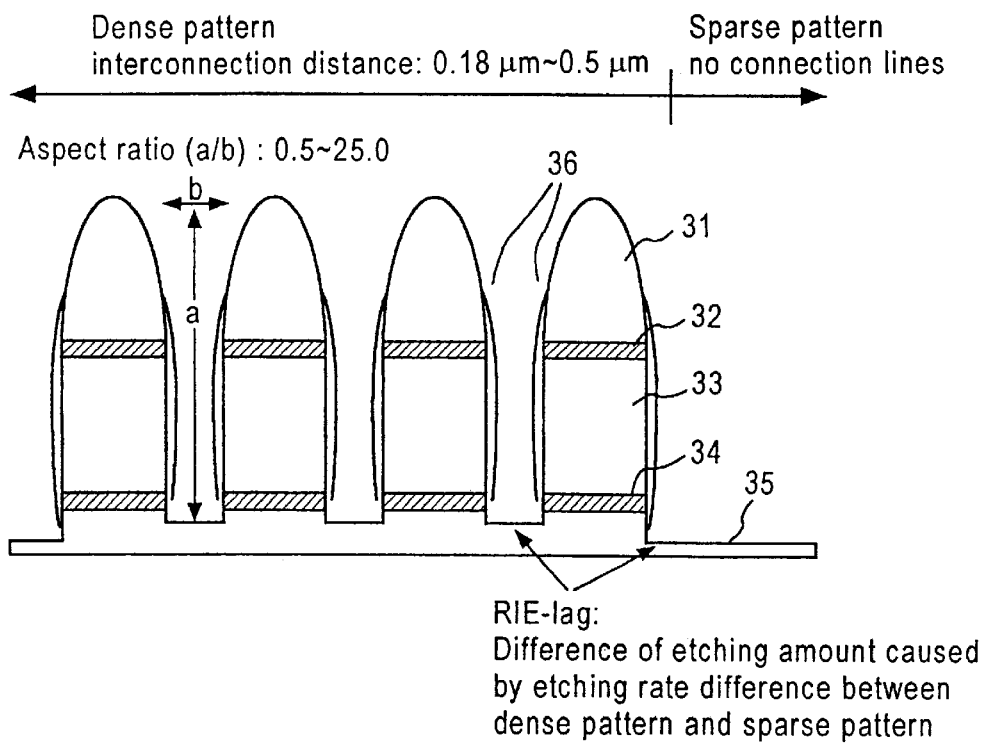
FIG. 9 shows etched shapes obtained by an etching method in which the etching apparatus of FIG. 1 was used and a pulse waveform voltage was applied in a pattern where the aperture ratio of a film to be etched was 60% or less.

FIG. 9 shows etched shapes obtained by an etching ethod in which the etching apparatus of FIG. 1 was used nd a pulsewaveform voltage was applied in a pattern where he aperture ratio of a film to be etched was 60% or less.

In this case, the sample to be etched was a wafer for manufacture of semiconductor devices such as DRAMs or SICs in which a film to be etched was constituted of an aluminum-copper film for instance. The aperture ratio of metal wiring layer was 60% or less, and the photoresist occupation area was relatively large in the wafer surface. Further, the aspect ratio, that is (etching depth)/(width of interconnection opening), fell at least within a range of 0.5 to 25.0 at densest patterns of metal interconnections. Etching processing gases were $Cl_2$ (flow rate: 80 sccm) and $BCl_3$ (flow rate: 20 sccm). The processing pressure was set at 1.33 to 13.3 Pa (10 to 100 mTorr). The frequency and the duty ratio of the pulse modulation were set at 1 kHz and 50%, respectively.

In FIG. 9, reference numeral 31 denotes a photoresist; 32, an anti-reflection coating (ARC); 33, an aluminum-copper alloy interconnection (film to be etched); 34, a titanium alloy; 35, a TEOS insulating film; and 36, a side wall protective film of reactive products produced from the films 31 to 34.

As seen from FIG. 9, a marked increase was attained in the selective ratio to a photoresist by virtue of similar effects to those described above.

Although a magnetron RIE scheme is used in the etching method of this embodiment, the invention is not limited to such a case. It goes without saying that the invention can also be applied to etching apparatuses and methods using high-frequency waves of other schemes.

Although the frequency of a pulse-modulated waveform is 1 kHz in this embodiment, similar effects can be obtained as long as the frequency is at least in a range of 1 Hz to 50 kHz. Further, similar effects can be obtained as long as the duty ratio is at least in a range of 20% to 75%.

Figure 10:
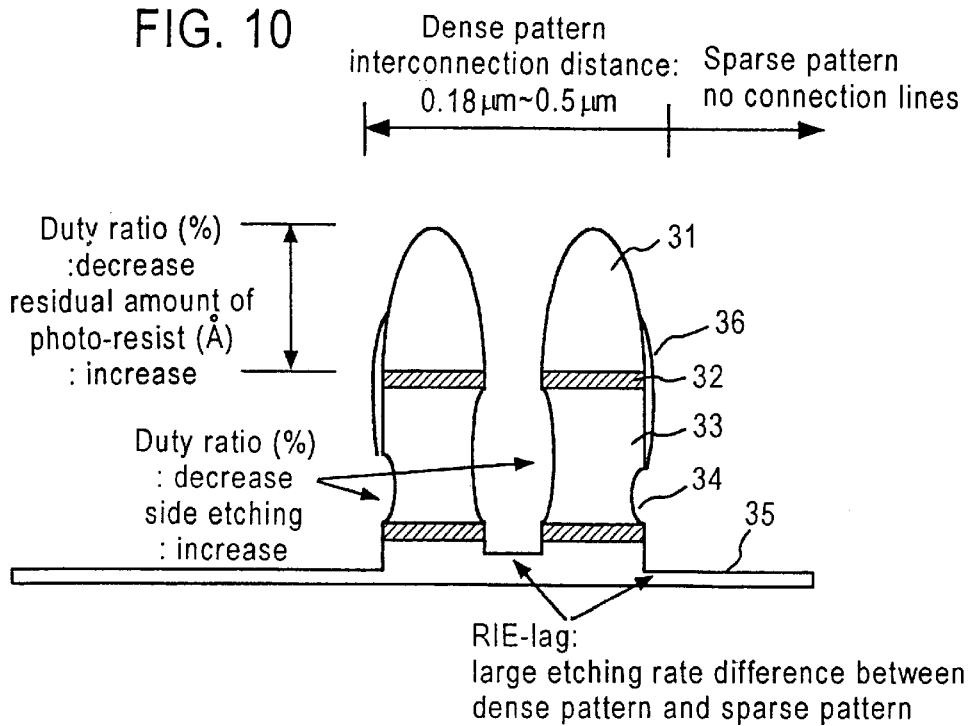
FIG. 10 shows another example of etched shapes obtained by an etching method in which the etching apparatus of FIG. 1 was used and a pulse waveform voltage was applied in a pattern where the aperture ratio of a film to be etched was 60% or more.

FIG. 10 shows another example of etched shapes obtained by an etching method in which the etching apparatus of FIG. 1 was used and a pulse waveform voltage was applied in a pattern where the aperture ratio of a film to be etched was 60% or more.

In this case, the sample to be etched was a wafer for manufacture of semiconductor devices such as DRAMs or ASICs in which a film to be etched was constituted of an aluminum-copper film for instance. The aperture ratio of a metal wiring layer was 60% or more, and the photoresist occupation area was relatively small in the wafer surface. The aspect ratio, that is (etching depth)/(width of interconnection opening), fell within a range of 0.5 to 25.0 at densest patterns of metal interconnections. Etching processing gases were $Cl_2$ (flow rate: 80 sccm) and $BCl_3$ (flow rate: 20 sccm). The processing pressure was set at 1.33 to 13.3 Pa(10 to 100 mTorr). The frequency and the duty ratio of the pulse modulation were set at 1 kHz and 50%, respectively.

As in the above-described case, as the duty ratio was decreased, the photoresist film residual amount after etching increased and the selective ratio to a photoresist increased. However, because the photoresist occupation area was small, the supply amount of reactive products produced from the photoresist and ions such as $Cl^-$ was small. As a result, side etching, side wall roughening, film peeling and the like occurred on the sidewall portions of respective interconnections 33 as shown in FIG. 10.

Since a larger amount of $BCl_3$ gas was introduced to solve these problems as described above, it was difficult to satisfy both of a high selective ratio to a resist and prevention of side wall roughening and side etching. Where the aperture ratio of metal interconnections is 60% or more and the photoresist occupation area is relatively small in the wafer surface, the RIE-lag amount is large and it is difficult to obtain a good shape.

Second Embodiment

Figure 11:
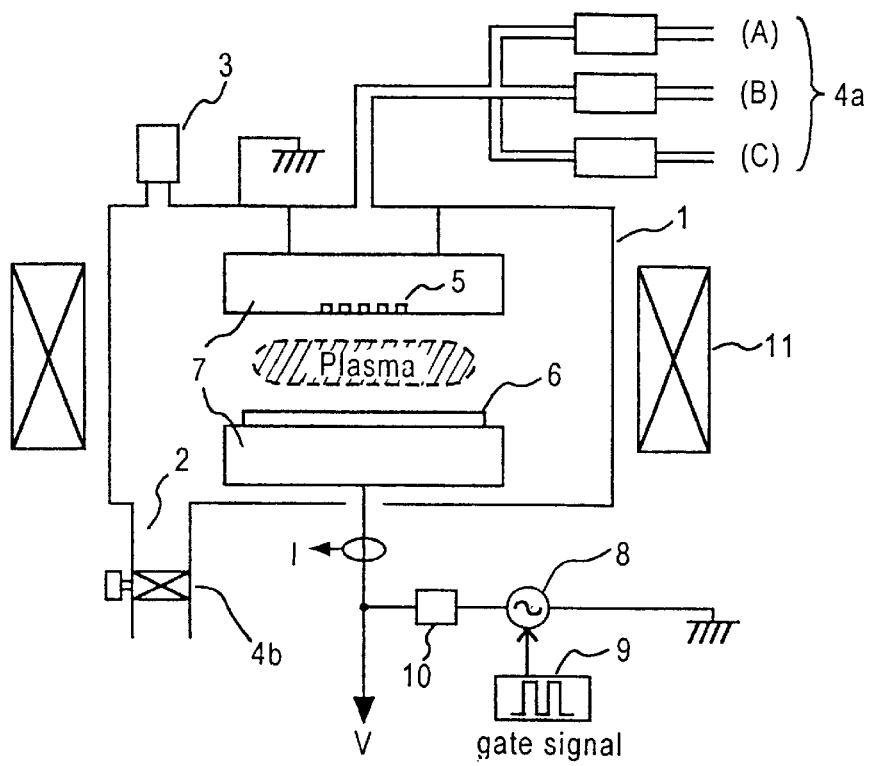
FIG. 11 shows a configuration of an etching apparatus according to a second embodiment of the present invention in which a pulse waveform voltage is applied.

FIG. 11 shows the configuration of an etching apparatus according to a second embodiment of the present invention in which a pulse waveform voltage is applied.

In FIG. 11, reference numeral 1 denotes a reaction container having in itself a reaction processing space in maintained in a vacuum. The pressure in the reaction processing space is controlled by an evacuation outlet 2, a vacuum pressure indicator 3 for indicating the pressure in the reaction container 1, and a vacuum pressure setting valve 4b. Processing gases A ($Cl_2$) and B ($BCl_3$) and a deposition-type gas C ($CHF_3$) whose flow rates are set by flow rate controllers 4a are introduced into the reaction container 1 through gas holes 5.

A control signal generator 9 controls the application voltage and the period of discharges caused by a pulse-modulated voltage. The control signal generator 9 is connected to a high-frequency power supply 8 for supplying RF power. RF power is supplied from the high-frequency power supply 8 to top and bottom electrodes 7 via a matching box 10 for a plasma impedance control. Supplied with a voltage from the high-frequency power supply 8, the top and bottom electrodes 7 form a capacitor via a sample 6 to be etched. During generation of a plasma, the plasma density is controlled through a magnetic field by three pairs of solenoid coils 11.

With the above apparatus, the sample 6 to be etched, such as a wafer, is etched by introducing ions to its surface and causing chemical reactions and sputtering.

The etching apparatus of this embodiment has the same configuration as the etching apparatus of FIG. 1 and additionally has a feature that a deposition-type gas including at least two of C, H, and F, such as a $CHF_3$ gas or a $CF_4$ gas, is added.

The etching apparatus of this embodiment not only exhibits similar performance as that of the etching apparatus of FIG. 1, but also provides improved etching characteristics by introducing a deposition-type gas including at least two of C, H, and F as the processing gas C as shown in FIG. 11.

Third Embodiment

Figure 12:
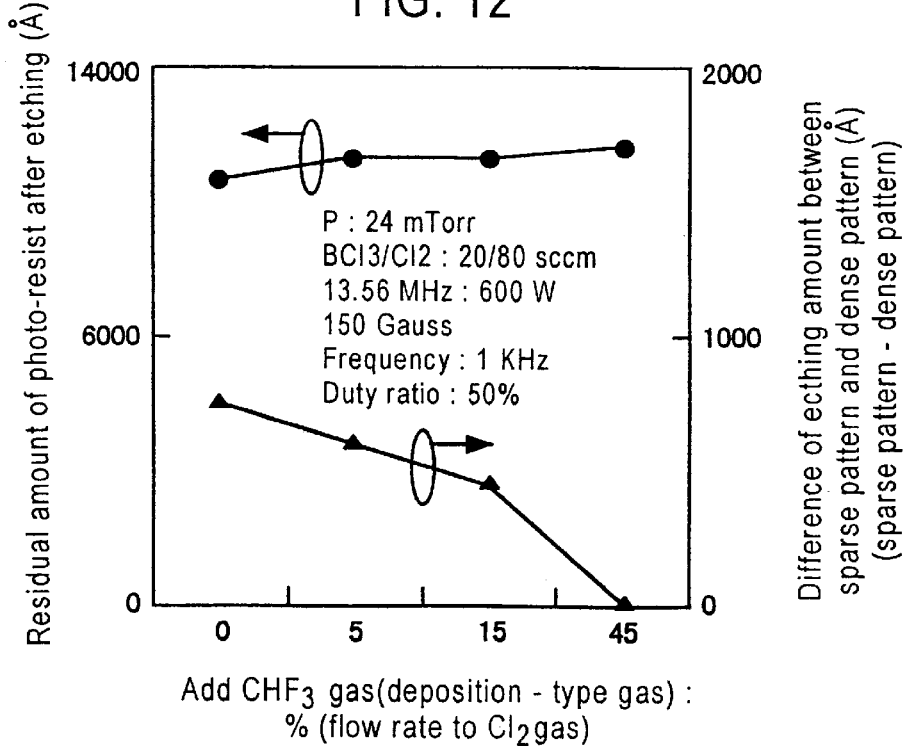
FIG. 12 shows etching tendencies in the RIE-lag amount and the residual amount of the photoresist film in an etching method in which the etching apparatus of the second embodiment is used, a bias having a pulse waveform is applied, and a deposition-type gas is added.

FIG. 12 shows etching tendencies in the RIE-lag amount and the residual amount of the photoresist film in an etching method in which the etching apparatus of the second embodiment is used, a bias having a pulse waveform is applied, and a deposition-type gas is added.

In this case, the etching apparatus of the second embodiment was used, and the sample to be etched was a wafer for manufacture of semiconductor devices such as DRAMs or ASICs in which a film to be etched was constituted of an aluminum-copper film or the like, the aperture ratio of a metal wiring layer was 60% or more, the photoresist occupation area was relatively small in the wafer surface, and the aspect ratio, that is (etching depth)/(width of interconnection opening), fell at least within a range of 0.5 to 25.0 at densest patterns of metal interconnections.

Etching processing gases were $Cl_2$ (flow rate: 80 sccm) and $BCl_3$ (flow rate: 20 sccm). The processing pressure was set at 3.192 Pa (24 mTorr). The frequency and the duty ratio of the pulse modulation were set at 1 kHz and 50%, respectively. A deposition-type gas of $CHF_3$ was added at a flow rate that was varied at least from 1% to 45% of the flow rate of $Cl_2$. FIG. 12 shows resulting tendencies of the residual amount of the photoresist film and the RIE-lag amount in the etched film.

As seen from FIG. 12, the residual amount of the photoresist film increases, and on the other hand, the RIE-lag amount decreases steeply. This is because reactive products produced from the deposition-type gas $CHF_3$ and ions such as $Cl^-$ during power-on periods of a pulse-modulated voltage excessively react at sparse patterns, to thereby reduce an etching rate difference between sparse patterns and dense patterns.

In FIG. 12, the RIE-lag amount is the difference of the etching amount of sparse patterns and that of dense patterns. (It is assumed that there is no etching rate difference between sparse patterns and dense patterns when the RIE-lag amount is 0 Å.)

Although a magnetron RIE scheme is used in this embodiment, the invention is not limited to such a case. The present invention can also be applied to etching apparatuses and methods using high-frequency waves of other schemes.

Although in this embodiment the frequency of a pulse-modulated waveform is 1 kHz, similar effects can be obtained as long as the frequency is at least in a range of 1 Hz to 50 kHz.

Further, similar effects can be obtained as long as the duty ratio is at least in a range of 20% to 75%.

Although in this embodiment the processing pressure is set at 3.192 Pa (24 mTorr), similar effects can be obtained by adding a deposition-type gas of $CHF_3$ as long as the processing pressure is at least in a range of 0.665 to 13.3 Pa (5 to 100 mTorr).

Figure 13:
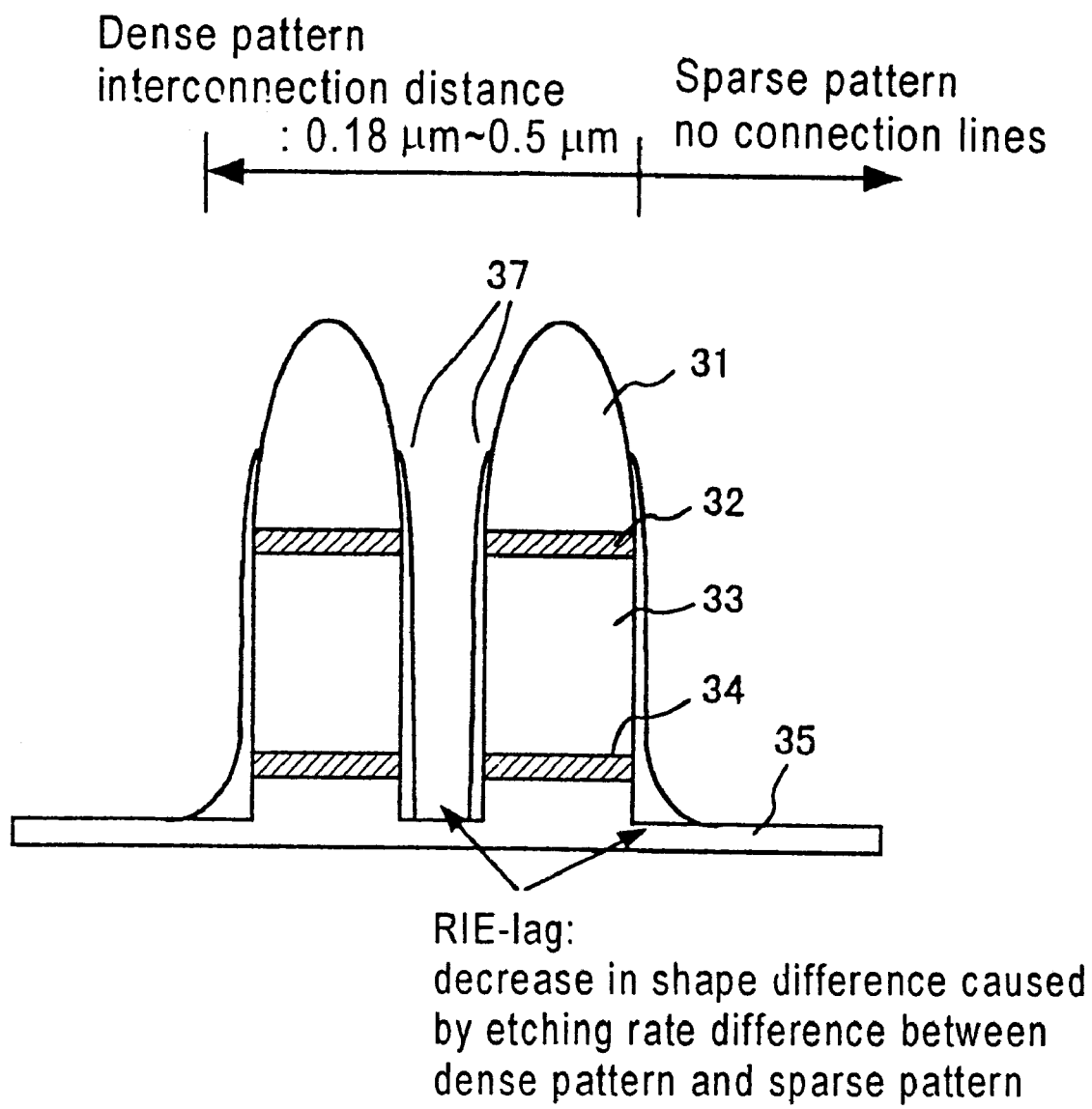
FIG. 13 shows an example of etched shapes obtained by an etching method in which the etching apparatus of FIG. 11 was used, a pulse waveform voltage was applied, and a deposition-type gas was added in a pattern where the aperture ratio of a film to be etched was 60% or more.
Figure 14:
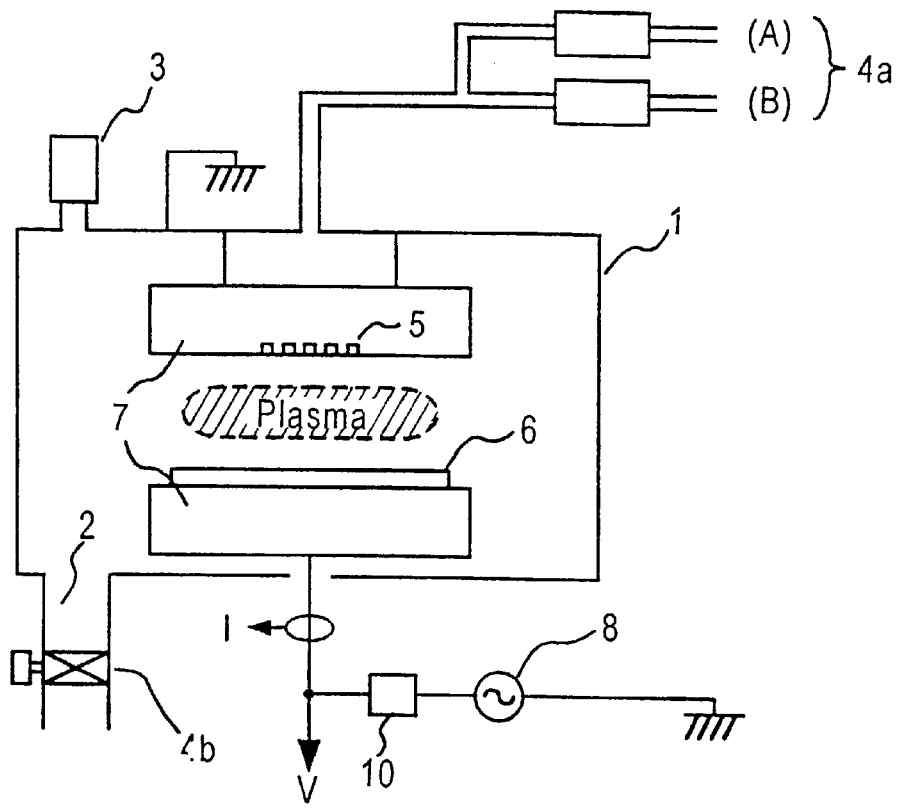
FIG. 14 shows the configuration of a conventional RF-biased etching apparatus.
Figure 15:
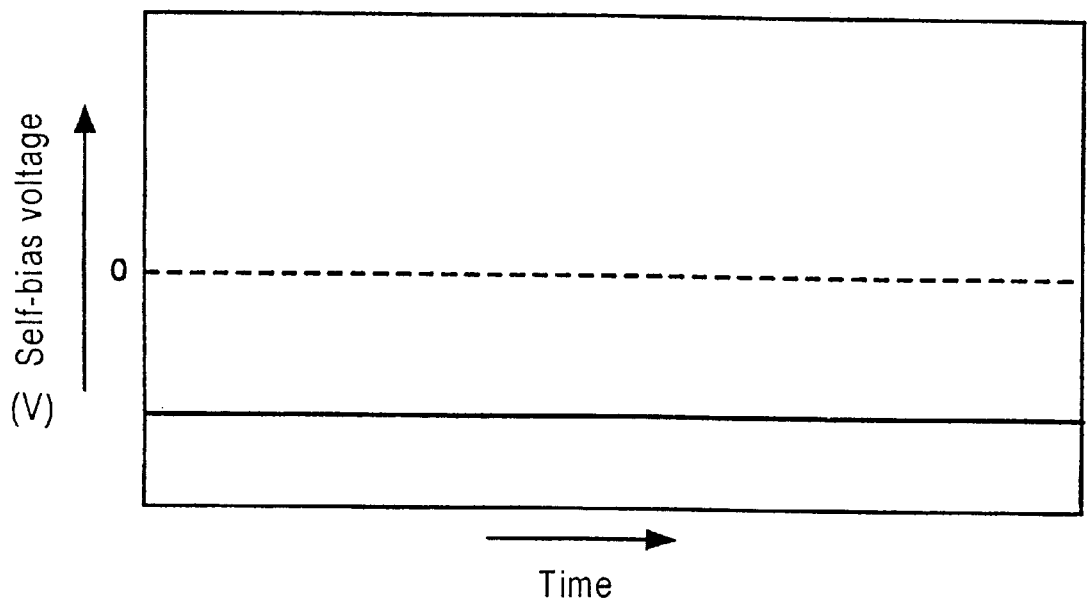
FIG. 15 shows a negative voltage appearing on a semiconductor substrate as a sample in a conventional etching method.

FIG. 13 shows an example of etched shapes obtained by an etching method in which the etching apparatus of FIG. 11 was used, a pulse waveform voltage was applied, and a deposition-type gas was added in a pattern where the aperture ratio of a film to be etched was 60% or more.

In this case, the etching apparatus of FIG. 11 was used, a voltage having a pulse waveform according to the invention was applied, and processing gases $Cl_2$, $BCl_3$, and $CHF_3$ were introduced. The sample to be etched was a wafer for manufacture of semiconductor devices such as DRAMs or ASICs in which a film to be etched was constituted of an aluminum-copper film etc., the aperture ratio of a metal wiring layer was 60% or more, the photoresist occupation area was relatively small in the wafer surface, and the aspect ratio, that is (etching depth)/(width of interconnection opening), fell at least within a range of 0.5 to 25.0 at densest patterns of metal interconnections. The flow rates of the etching processing gases $Cl_2$ and $BCl_3$ were set at 80 sccm and 20 sccm, respectively. The processing pressure was set at 1.33 to 13.3 Pa (10 to 100 mTorr). The frequency of the pulse modulation were set at a value at least in a range of 1 Hz to 50 kHz and the duty ratio was set at a value at least in a range of 20% to 75%, respectively.

In FIG. 13, reference numeral 37 denotes a side wall protective film formed by reactive products produced from a photoresist and the wiring film and reactive products produced from the deposition-type gas including at least two of C, H, and F. By adding $CHF_3$ at a flow rate that is at least in a range of 1% to 45% of the flow rate of $Cl_2$, reactive products produced from $CHF_3$ and ions such as $Cl^-$ assist generation of CHCl-type and CCl-type reactive products that are produced by sputtering of $BCl_3$ on the photoresist, whereby the RIE-lag amount was decreased as shown in FIG. 12 and a high selective ratio to a photoresist was obtained. Further, by adding $CHF_3$ at the optimum flow rate to assist $BCl_3$, excessive generation of reactive products was prevented, whereby good vertical shapes were obtained that were free of foreign substances and residues as well as an RIE-lag.

The above-mentioned effects can be obtained in a similar manner for a sample to be etched such as a wafer for manufacture of semiconductor devices like DRAMs or ASICs in which a film to be etched is constituted of an aluminum-copper film etc., the aperture ratio of a metal wiring layer is 60% or less, the photoresist occupation area is relatively large in the wafer surface, and the aspect ratio, that is (etching depth)/(width of interconnection opening), falls at least within a range of 0.5 to 25.0 at densest patterns of metal interconnections.

Although in this embodiment the flow rates of the etching processing gases $Cl_2$ and $BCl_3$ are set at the optimum values of 80 sccm and 20 sccm, respectively, the above-mentioned effects can be obtained even if the flow rates and the total flow amounts are increased or decreased.

The characteristics of FIGS. 6 to 8 described in the first embodiment are also obtained in similar manners in the third embodiment in which a deposition-type gas is added. However, redundant descriptions therefor are omitted.

The deposition gas is a composite gas that includes at least two of C, H, and F, and produces reactive products by reacting with a resist, and causes the reactive products to stick to side walls of etching patterns. $CHF_3$ and $CF_4$ gases are typical examples of such a deposition-type gas.

As described above, in the etching apparatus and method of the present invention, etching is performed under predetermined conditions by using a pulse-modulated high-frequency application voltage, and $Cl_2$ and $BCl_3$ gases are used as main etching processing gases, and a deposition-type gas such as $CHF_3$ is used to assist formation of side wall protective films. Therefore, etching can be performed at a high selective ratio to a photoresist.

Etching can be performed without being influenced by foreign substances due to deposition of reactive products.

An RIE-lag (i.e., an etching rate difference between sparse patterns and dense patterns in a film to be etched) does not occur and good vertically etched shapes can be obtained.

Also obtained are a manufacturing method of a semiconductor device to which such an etching method is applied, and a semiconductor device manufactured by this manufacturing method.

Obviously many modifications and variations of the present invention are possible in the light of the above teachings. It is therefore to be understood that within the scope of the appended claims the invention may by practiced otherwise than as specifically described.

What is claimed is:

1. A method of etching a metal layer over a semiconductor substrate, the metal layer having a photoresist layer thereon, the method comprising the steps of:

introducing the semiconductor substrate into a processing container, introducing, into said processing container, etching processing gases in which a deposition-type gas composed of at least two of C, H, and F is added to main etching processing gas including a $Cl_2$ gas and a $BCl_3$ gas;

applying a pulse-modulated high-frequency voltage between a pair of electrodes that are provided in said processing container so as to be opposed to each other and to hold said substrate, such that said high frequency voltage is turned on and off to establish a duty ratio;

generating a plasma between said pair of electrodes;

etching said metal layer by using said plasma; and controlling said duty ratio to increase the selective ratio of the etching rate of the metal layer to the etching rate of the photoresist layer.

2. The method according to claim 1, wherein said deposition-type gas is selected from a $CHF_3$ gas or a $CF_4$ gas.

3. The method according to claim 1, wherein said deposition-type gas is added at a flow rate that is in a range of 1% to 45% of a flow rate of the $Cl_2$ gas.

4. The method according to claim 1, wherein a processing pressure of etching is set at a value in a range of 0.665 to 13.3 Pa.

5. The method according to claim 1, wherein pulse modulation is performed in such a manner that the high-frequency voltage that is applied between said pair of electrodes are turned on and off at a modulation frequency in a range of 1 Hz to 50 kHz.

6. The method according to claim 1, wherein said pulse modulation is performed in such a manner that said high-frequency voltage that is applied between said pair of electrodes are turned on and off with a duty ratio in a range of 20% to 75%.

7. The method according to claim 1, wherein said pulse modulation is performed so that an amplitude of said high-frequency voltage that is applied between said pair of electrodes has a first predetermined voltage that is 0 V or more in a discharge suspension period and a second predetermined voltage that is higher than said first predetermined voltage in a discharge period.

8. A method of manufacturing a semiconductor device, comprising etching said metal layer on a semiconductor substrate by the method according to claim 1.

9. A semiconductor device manufactured by the manufacturing method according to claim 8.

* * * * *